US011474159B2

(12) United States Patent
Wang et al.

(10) Patent No.: US 11,474,159 B2
(45) Date of Patent: Oct. 18, 2022

(54) ESTIMATION METHOD OF BATTERY STATE OF HEALTH BASED ON STANDARD SAMPLE AND DUAL-EMBEDDED DECOUPLING

(71) Applicant: JIANGSU UNIVERSITY, Zhenjiang (CN)

(72) Inventors: Limei Wang, Zhenjiang (CN); Sibing Qiao, Zhenjiang (CN); Xiuliang Zhao, Zhenjiang (CN); Dong Lu, Zhenjiang (CN); Ruochen Wang, Zhenjiang (CN); Ying Xu, Zhenjiang (CN); Ying Zhang, Zhenjiang (CN); Chaofeng Pan, Zhenjiang (CN); Zhigang He, Zhenjiang (CN); Yingfeng Cai, Zhenjiang (CN); Long Chen, Zhenjiang (CN)

(73) Assignee: JIANGSU UNIVERSITY, Zhenjiang (CN)

( * ) Notice: Subject to any disclaimer, the term of this patent is extended or adjusted under 35 U.S.C. 154(b) by 0 days.

(21) Appl. No.: 17/571,599

(22) Filed: Jan. 10, 2022

(65) Prior Publication Data

US 2022/0236335 A1 Jul. 28, 2022

(30) Foreign Application Priority Data

Jan. 26, 2021 (CN) .......................... 202110105834.9

(51) Int. Cl.
*G01R 31/392* (2019.01)
*G01R 31/388* (2019.01)
(Continued)

(52) U.S. Cl.
CPC ....... *G01R 31/392* (2019.01); *G01R 31/3648* (2013.01); *G01R 31/374* (2019.01); *G01R 31/388* (2019.01)

(58) Field of Classification Search
CPC ........................... G01R 31/392; G01R 31/374
(Continued)

(56) References Cited

U.S. PATENT DOCUMENTS

2017/0315179 A1* 11/2017 Baba ..................... G01R 31/389
2018/0106868 A1* 4/2018 Sung .......................... B60L 3/12
(Continued)

*Primary Examiner* — Ricky Go
(74) *Attorney, Agent, or Firm* — Bayramoglu Law Offices LLC

(57) ABSTRACT

A battery State of Health estimation method based on a standard sample and a dual-embedded decoupling includes the steps of extracting significant characteristic peaks of the standard sample, mechanism parameter calibration of the standard sample, and on-line State of Health estimation of the test battery. The battery State of Health estimation method expounds the dual coupling relationship between temperature and aging on the characteristic peak voltage of Incremental Capacity curve from the perspective of impedance characteristic mechanism analysis, and proposes a method eliminating the voltage deviation caused by the most temperature-sensitive charge transfer resistance based on the "standard sample" to realize the decoupling of the first layer. Further, when the Solid Electrolyte Interface film resistance affected by the aging and temperature coupling conforms to a linear relationship as a whole, the embedded decoupling can be realized by establishing the relation function between the linear relationship coefficient and temperature.

8 Claims, 6 Drawing Sheets

(51) Int. Cl.
*G01R 31/374* (2019.01)
*G01R 31/36* (2020.01)

(58) Field of Classification Search
USPC .......................................................... 702/63
See application file for complete search history.

(56) References Cited

U.S. PATENT DOCUMENTS

2019/0212391 A1* 7/2019 Koller ..................... B60L 58/16
2020/0341064 A1* 10/2020 Miftahullatif ......... H01M 50/20

* cited by examiner

ESTIMATION METHOD OF BATTERY STATE OF HEALTH BASED ON STANDARD SAMPLE AND DUAL-EMBEDDED DECOUPLING

CROSS REFERENCE TO THE RELATED APPLICATIONS

This application is based upon and claims priority to Chinese Patent Application No. 202110105834.9, filed on Jan. 26, 2021, the entire contents of which are incorporated herein by reference.

TECHNICAL FIELD

The invention relates to a battery performance estimation method, in particular to an estimation method of battery State of Health based on "standard sample" and "dual-embedded decoupling" in a wide temperature range, belonging to the technical field of power battery.

BACKGROUND

With the rapid development of Electric Vehicles, power batteries, the main power source of Electric Vehicles, have attracted more and more attention. Lithium-ion battery is widely used due to high specific energy, high specific power and so on. However, as the number of cycles increases, the electrode active material of a battery is gradually consumed. This phenomenon eventually brings battery aging and the decline of State of Health. With the aging of the battery, the internal resistance increases and the capacity decreases. It eventually brings the decline of the battery performance and the increase of the breakdown rate of Electric Vehicles. Thus, accurate State of Health estimation can ensure the battery safety and improve the usage performance of Electric Vehicles.

Battery State of Health estimation methods can be roughly divided into two categories: model-based methods and data-driven methods. Model-based methods need to establish a battery model to get mathematical expressions, and then solve the parameters of the model through some intelligent algorithms. These methods suffer from the drawback of complex calculation and low utility. Data-driven methods do not require establish the battery model. It can overcome the shortage of model-based methods. The general data-driven methods include Artificial Neural Network, Support Vector Machine, Gauss Process Regression, etc. The above mentioned methods are similar. State of Health of the given sample battery can be predicted by using the data (such as charging and discharging current, voltage and temperature, etc.) and the corresponding aging state data of a given sample battery. However, on the one hand, these methods are prone to overfitting, and on the other hand, it takes a lot of time to pre-process the input data.

In recent years, battery State of Health estimation methods based on Incremental Capacity Analysis are increasingly studied by researchers. The battery Incremental Capacity curve, that is, the differential curve of the battery capacity-voltage curve, converts the voltage platform containing severe internal reaction into multiple intuitive and identifiable peaks. By analyzing the characteristics of these peaks, the battery aging mode and mechanism can be deduced, and then the State of Health of the battery can be estimated. During the actual operation, the working conditions of the battery are more complicated. The battery will release a lot of heat after a long time of charging and discharging, and the accumulated heat cannot be quickly dissipated to the outside. These phenomena will eventually cause the battery temperature to be much higher than the outside temperature. However, most of the previous research was conducted at a standard temperature, but the temperature will directly affect the chemical reaction of the battery. Many basic performance parameters of the battery, such as capacity and internal resistance, will change at different temperatures, and the Incremental Capacity curve will also shift to different degrees. It eventually leads to a large difference in the accuracy of the Incremental Capacity curve to solve the State of Health at different temperatures.

SUMMARY

Purpose of the Invention

Aiming at the problems existing in the prior art, the invention provides a battery State of Health estimation method based on a standard sample and a dual-embedded decoupling. By studying the influence mechanism of temperature and aging on the Incremental Capacity curve characteristics of the battery, the present invention realizes the decoupling of the influence of temperature and aging on the Incremental Capacity curve characteristics, and broadens the temperature range of the Incremental Capacity curve to solve the battery State of Health. Finally, based on "standard sample" and "dual-embedded decoupling", the State of Health estimation of the battery in a wide temperature range is achieved.

Technical Solution: A battery State of Health estimation method based on a standard sample and a dual-embedded decoupling, includes the following steps:

S1: Extracting the significant characteristic peaks of the standard sample: Firstly, a same type of batteries with different aging states are selected to conduct constant-current charging tests at the same temperature. Then, any one of the above batteries are selected to carry out constant-current charging tests at different temperatures. The battery current, voltage and temperature in each test are collected. Finally, based on the above data, the Incremental Capacity curves of the batteries with different aging states and at different temperatures are drawn, and the significant characteristic peaks of the standard sample are selected by analyzing the above Incremental Capacity curves.

S2. Calibration of mechanism parameters of the standard sample: Three relation functions of the standard sample are obtained based on dual-embedded embedded decoupling.

The relation function one is a relation function between the temperature and the voltage deviation $\Delta U_{ct,T}$ caused by the change of the charge transfer resistance $R_{ct}$, when the standard sample battery is not aging.

The relation function two is a linear relationship function between the aging state and the voltage deviation $\Delta U_{SEI,cycle,T}$ at the same temperature. Among them, the voltage deviation $\Delta U_{SEI,cycle,T}$ is caused by the Solid Electrolyte Interface film resistance after eliminating the influence of the charge transfer resistance $R_{ct}$.

The relation function three is a relation function between the linear relationship coefficient and the temperature.

S3. On-line estimation of State of Health of a test battery: constant-current charging test is carried out for the test battery, and the current, voltage and temperature $T_{peak}$ are collected. Based on the collected data, the Incremental Capacity curve of the test battery is calculated and the voltage of the significant characteristic peak corresponding to the standard sample is extracted. The State of Health is solved according to the three relation functions of the dual-embedded decoupling in S2.

Further, the significant characteristic peak is a characteristic peak with obvious relative change and located near the median voltage.

Further, in the relation function one in S2, the voltage deviation caused by the change of the charge transfer resistance $R_{ct}$ is the voltage deviation $\Delta U_{ct,T}$ caused by the temperature at the significant characteristic peak of the standard sample battery whose State of Health is 100%. The relation function between the temperature T and the voltage deviation $\Delta U_{ct,T}$ of the standard sample battery is described by an Arrhenius function as:

$$\Delta U_{ct,T} = a_{ct} \exp(b_{ct}/T) + c_{ct}$$

Where, $a_{ct}$, $b_{ct}$ and $c_{ct}$ are temperature fitting parameters related to the charge transfer resistance.

Further, the standard sample battery with 100% State of Health is a virtual battery after the average of at least three batteries with 100% State of Health that meet factory requirements. The fitting result is quantitatively evaluated by the coefficient of determination $R^2$. The specific evaluation formula is as follows:

$$R^2 = 1 - \frac{\sum_{i=1}^{N}(V_i - \tilde{V}_i)^2}{\sum_{i=1}^{N}(V_i - \hat{V}_{mean})^2}, \quad \hat{V}_{mean} = \frac{1}{N}\sum_{i=1}^{N} V_i$$

Where, $V_i$ is the measured voltage, $\tilde{V}_i$ denotes the fitting voltage, $\hat{V}_{mean}$ is the mean of the measured voltage, and N denotes the amount of measured data. The closer $R^2$ is to 1, the better the fitting accuracy is.

Further, in the relation function two in S2, the linear relationship function between the aging state and the voltage deviation $\Delta U_{SEI,cycle,T}$ caused by the influence of the Solid Electrolyte Interface film resistance at the same temperature can be described as:

$$\Delta U_{SEI,cycle,T} = k_{SEI,T} SOH + b_{SEI,T}$$

Where, $k_{SEI,T}$ and $b_{SEI,T}$ are the linear relationship coefficients related to the Solid Electrolyte Interface film resistance, SOH is battery State of Health.

Further, a method to obtain the linear relationship function between the aging state and the voltage deviation $\Delta U_{SEI,cycle,T}$ after eliminating the influence of the charge transfer resistance is as follows: Firstly, at least three test batteries with State of Health between 100% and 80% are selected. Then the linear relationship function between the aging state and the voltage deviation $\Delta U_{SEI,cycle,T}$ is linear fitted. Finally, a relationship between the linear relationship coefficient $k_{SEI,T}$ and $b_{SEI,T}$ is obtained. Among them, $k_{SEI,T} = -0.01\, b_{SEI,T}$. Thus, the above linear relationship function between the aging state and the voltage deviation $\Delta U_{SEI,cycle,T}$ can be further simplified as:

$$\Delta U_{SEI,cycle,T} = -0.01 b_{SEI,T} SOH + b_{SEI,T}$$

Further, in the relation function three in S3, the relation function between the linear relationship coefficient and the temperature T can be described as:

$$k_{SEI,T} = kb_{SEI,T} = A_{SEI} \exp(B_{SEI}/T) + C_{SEI}$$

Where, $A_{SEI}$, $B_{SEI}$ and $C_{SEI}$ are the temperature fitting parameters related to the Solid Electrolyte Interface film resistance, k represents the linear relationship coefficient between $k_{SEI,T}$ and $b_{SEI,T}$.

Further, a solution method of State of Health in S3 is as follows:

Firstly, a measured temperature $T_{peak}$ is taken as input and $\Delta U_{ct,T}$ is obtained according to the relation function between the temperature and the voltage deviation $\Delta U_{ct,T}$ in S2.

Secondly, a measured voltage $U_{peak}$ is taken as input to obtain $\Delta U_{SEI,cycle,T}$ according to $\Delta U_{SEI,cycle,T} = U_{peak} - \Delta U_{ct,T}$.

Thirdly, according to the relation function between the linear relationship coefficient and the temperature at different temperatures in S2, the measured temperature $T_{peak}$ is taken as the input to obtain the linear relationship coefficient at the current temperature.

Finally, according to the linear relationship function between the aging state and the voltage deviation $\Delta U_{SEI,cycle,T}$, the State of Health of the test battery is obtained.

The Benefits of the Invention

The present invention expounds a dual coupling relationship between temperature and aging on the characteristic peak voltage of the Incremental Capacity curve from the perspective of impedance characteristic mechanism analysis, and proposes a method eliminating the voltage deviation caused by the charge transfer resistance which is most sensitive to temperature based on the "standard sample" to realize the decoupling of the first layer. Subsequently, in view of the voltage deviation caused by the Solid Electrolyte Interface film resistance affected by aging and temperature coupling, supposing the overall aging law meets a linear relationship, the embedded decoupling is realized by establishing the relation function between the linear relationship coefficient $k_{SEI,T}$ and the temperature. Finally, the battery State of Health estimation based on Incremental Capacity curve characteristics in the wide temperature range is realized by dual decoupling combining first-layer decoupling and embedded decoupling.

The invention not only inherits the high efficiency of State of Health estimation based on Incremental Capacity curve, but also overcomes the defect of unclear mechanism of data-driven method. From the perspective of mechanism analysis, the problem of low accuracy in estimating State of Health based on Incremental Capacity curve in the wide temperature range is solved.

DETAILED DESCRIPTION OF THE EMBODIMENTS

Figure 1:
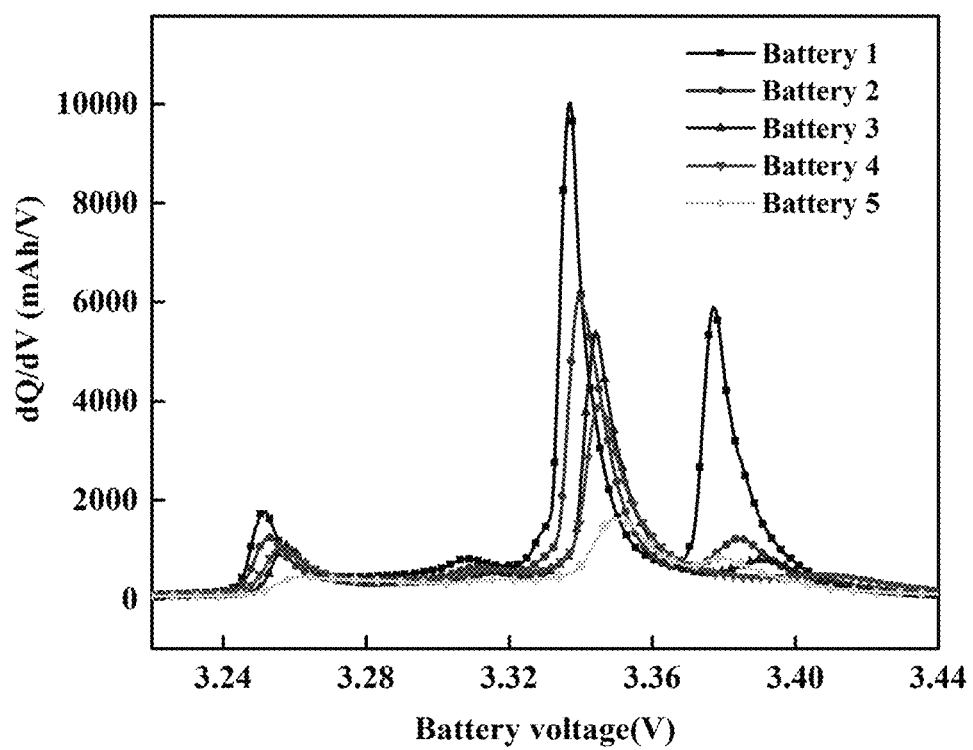
FIG. 1 shows the Incremental Capacity curves of batteries with different aging states.

The present invention will be further described below in combination with figures and a specific embodiment, but the scope of protection of the invention is not limited.

The present invention proposes a method for estimating a battery State of Health in a wide temperature range based on "standard sample" and "dual-embedded decoupling". It mainly includes impedance characteristic analysis, temperature and aging dual-embedded decoupling, Incremental Capacity curve solution and characteristic analysis, online estimation of State of Health based on "standard sample".

In the above impedance characteristic analysis, the battery impedance mainly contains the bulk resistance of the electrolyte, separator and electrode, the Solid Electrolyte Interface film resistance and the charge transfer resistance. It can be expressed as:

$$R = R_{bulk} + R_{SEI} + R_{ct} \quad (1)$$

Where, R is the battery impedance, $R_{bulk}$ is the bulk resistance, $R_{SEI}$ is the Solid Electrolyte Interface film resistance and $R_{ct}$ is the charge transfer resistance.

Battery aging causes impedance changes. The aging modes mainly include the loss of lithium inventory and the loss of active material. The capacity loss rate of lithium-ion batteries for electric vehicles is generally less than 20%. In this use interval, the formation and growth of the Solid Electrolyte Interface film between electrode and electrolyte leads to the loss of lithium inventory, and the increase of the Solid Electrolyte Interface film volume is directly proportional to the consumption of lithium inventory. Considering that the radius of the active particles is much larger than the thickness of the Solid Electrolyte Interface film produced on them, it can be approximately considered that the area of the Solid Electrolyte Interface film covering the surface of the active particle does not change in the early stage of aging. The consumption of lithium inventory is proportional to the change in the Solid Electrolyte Interface film thickness, and the increase in the Solid Electrolyte Interface film thickness is proportional to the increase in $R_{SEI}$. Thus, the change of $R_{SEI}$ and the degree of aging (loss of lithium inventory) can be approximately considered to a linear relationship. This phenomenon shows that Incremental Capacity curve moves to the high voltage as a whole at a certain temperature. Meanwhile, in the early stage of aging, $R_{bulk}$ and $R_{ct}$ of the battery remain basically unchanged under the condition of a constant temperature. Therefore, the impedance changes caused by aging are as follow:

$$\Delta R_{cycle} = \Delta R_{bulk,cycle} + \Delta R_{SEI,cycle} + \Delta R_{ct,cycle} \approx \Delta R_{SEI,cycle} \quad (2)$$

Where, $\Delta R_{cycle}$ is the increase of battery impedance by aging changing, $\Delta R_{bulk,cycle}$ is the increase of the bulk resistance by aging changing, $\Delta R_{SEI,cycle}$ is the increase of the Solid Electrolyte Interface film resistance by aging changing, and $\Delta R_{ct,cycle}$ is the increase of the charge transfer resistance by aging changing.

The electrolyte solution of lithium battery is lithium salt electrolyte and organic solvent, in which the conduction of electrolyte mainly depends on ion movement. Within a certain temperature range, as the temperature decreases, the ion activity in the battery is lower and the ion migration speed decreases. It leads to an increase in the charge transfer resistance $R_{ct}$, and this impedance is more sensitive to low temperature. In the Incremental Capacity curve, it is intuitively shown that the lateral deviation of the curve is small at high temperature, but large at low temperature. On the other hand, the temperature not only affects the ionic conductivity in the electrolyte, but also affects the ionic conductivity in the Solid Electrolyte Interface film. As the temperature increases, the ionic conductivity in the Solid Electrolyte Interface film also increases. It is manifested as a decrease in the impedance of the Solid Electrolyte Interface film. Thus, the effects of temperature and aging on the impedance of the Solid Electrolyte Interface film are coupled. Relatively speaking, the bulk resistance is related to battery itself and is not sensitive to temperature. Therefore, the change in the resistance of the battery caused by temperature change can be expressed as:

$$\Delta R_T = \Delta R_{bulk,T} + \Delta R_{SEI,T} + \Delta R_{ct,T} \approx \Delta R_{SEI,T} + \Delta R_{ct,T} \quad (3)$$

Where, $\Delta R_T$ is an increase of battery impedance by temperature changing, $\Delta R_{bulk,T}$ is an increase of the bulk resistance by temperature changing, $\Delta R_{SEI,T}$ is an increase of the Solid Electrolyte Interface film resistance by temperature changing, and $\Delta R_{ct,T}$ is an increase of the charge transfer resistance by temperature changing.

Combined Eq. (2) and (3), it can be seen that an increase in battery impedance caused by aging and temperature changing can be described as:

$$\Delta R = \Delta R_{SEI,T} + \Delta R_{SEI,cycle} + \Delta R_{ct,T} \quad (4)$$

From the above analysis, it can be seen that the charge transfer resistance $\Delta R_{ct}$ is only affected by temperature and is not sensitive to aging. However, the Solid Electrolyte Interface film resistance $\Delta R_{SEI}$ is both affected by aging and temperature. Therefore, Eq. (4) can be further expressed as:

$$\Delta R = \Delta R_{SEI,cycle,T} + \Delta R_{ct,T} \quad (5)$$

Where, $\Delta U_{SEI,cycle,T}$ is an increase of resistance caused by the coupling of temperature and aging.

In the above-mentioned temperature and aging dual-embedded decoupling method, the charge transfer resistance caused by temperature can be described by an Arrhenius function. Meanwhile, at the same temperature, the change of the Solid Electrolyte Interface film resistance $\Delta R_{SEI}$ and the aging (loss of lithium inventory) can be approximately considered to a linear relationship. At different temperatures, the Solid Electrolyte Interface film resistance $\Delta R_{SEI}$ is related with temperature. Because the thickness of Solid Electrolyte Interface film is about 20 nm~120 nm and its ion migration path is relatively short, it is more sensitive to aging. Therefore, the $\Delta R_{SEI,cycle,T}$ caused by the coupling of aging and temperature can be considered conforms to a linear relationship, and the linear relationship coefficient $k_{SEI}$ can be described by an Arrhenius function. Eq. (5) can be further described as:

$$\begin{cases} R_{SEI,cycle} = k_{SEI}SOH + b_{SEI} \\ R_{ct,T} = a_{ct}\exp(b_{ct}/T) + c_{ct} \\ k_{SEI} = kb_{SEI} = A_{SEI}\exp(B_{SEI}/T) + C_{SEI} \end{cases} \quad (6)$$

Where, T is the actual temperature of the battery, $k_{SEI,T}$ and $b_{SEI,T}$ are the linear relationship coefficient related to the Solid Electrolyte Interface film resistance, $a_{ct}$, $b_{ct}$ and $c_{ct}$ are temperature fitting parameters related to the charge transfer resistance, and $A_{SEI}$, $B_{SEI}$ an $C_{SEI}$ are temperature fitting parameters related to the Solid Electrolyte Interface film resistance.

Combined with Eq. (6), the voltage deviation of Incremental Capacity curve during the constant-current charging stage can be described as:

$$\begin{cases} \Delta U_{SEI,cycle} = k_{SEI}SOH + b_{SEI} \\ \Delta U_{ct,T} = a_{ct}\exp(b_{ct}/T) + c_{ct} \\ k_{SEI} = kb_{SEI} = A_{SEI}\exp(B_{SEI}/T) + C_{SEI} \end{cases} \quad (7)$$

Where, $\Delta U_{ct,T}$ is voltage deviation caused by the charge transfer resistance and $\Delta U_{SEI,cycle,T}$ is voltage deviation caused by the Solid Electrolyte Interface film resistance.

According to Eq. (7), firstly, for the batteries at different temperatures, $\Delta U_{ct,T}$ caused by the charge transfer resistance $\Delta R_{ct}$ that is most sensitive to temperature can be eliminated. Then, $\Delta U_{SEI,cycle,T}$ caused by $\Delta R_{SEI,cycle,T}$ influenced by aging and temperature coupling can be obtained. Meanwhile, the voltage deviation is described by a linear relationship and the linear relationship coefficient is described by the Arrhenius function. Thus, the voltage deviation caused by $\Delta R_{SEI,cycle}$ alone is obtained. Finally, the dual-embedded decoupling of temperature and aging on Incremental Capacity curve is realized.

In the above Incremental Capacity curve solution and characteristics analysis, the Incremental Capacity curve can be solved by conventional numerical differentiation, polynomial fitting and probability density function method, or the method in the invention patent (CN 109632138 A). The present invention only provides examples, and does not specifically limit the solution method.

Figure 2:
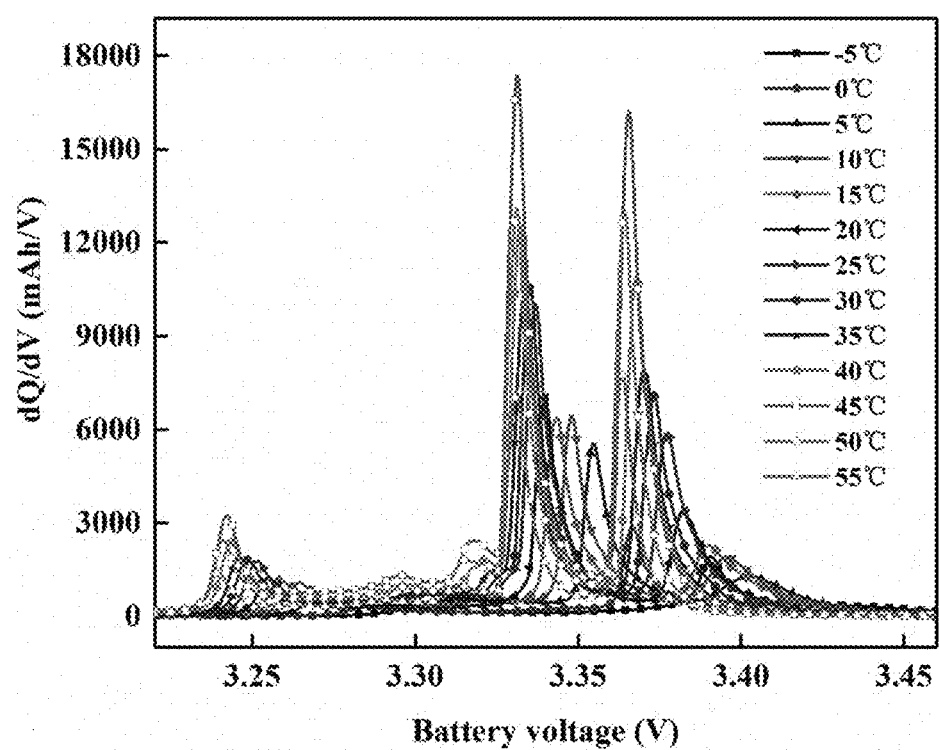
FIG. 2 shows the Incremental Capacity curves of a battery at different temperatures.

In the above Incremental Capacity curve characteristic analysis: FIG. 1 shows the Incremental Capacity curve of batteries with different aging states, and FIG. 2 shows the Incremental Capacity curve of a battery at different temperatures. It can be seen from FIG. 1 that as the degree of aging increases, the characteristic peak of the Incremental Capacity curve shifts laterally to the right, and the peak height decreases. It can be seen from FIG. 2 that as the temperature rises, the characteristic peak of the Incremental Capacity curve laterally shifts to the left, and the peak height rises. In the constant-current charging stage, the voltage deviation of the Incremental Capacity curve can be approximately attributed to the influence of impedance. The impedance increase caused by the decrease of temperature and the increase of aging leads to the lateral voltage shift to the right. Among the three main characteristic peaks of the Incremental Capacity curve, the second characteristic peak has obvious relative change and is located near the median voltage. Therefore, in the invention, the second characteristic peak as a significant characteristic peak is selected to study the correlation between its characteristic change and aging/temperature.

The above online State of Health estimation based on "standard sample" can be divided into mechanism parameter calibration stage and online estimation stage.

The above-mentioned mechanism parameter calibration stage: firstly, different temperature and aging tests are carried out to acquire the corresponding voltage, current and temperature. Then, the Incremental Capacity curve is calculated to obtain second characteristic peak voltage. Finally, the parameters in three mechanism relationships are calibrated by Eq. (7). Three calibration mechanism relationships include: 1) For the unaged battery, the relation function between the temperature and the voltage deviation caused by the change of $R_{ct}$; 2) At the same temperature, the linear relationship function between the aging state and the voltage deviation after eliminating the influence of $R_{ct}$; 3) The relation function between the linear relationship coefficient and the temperature.

Figure 3:
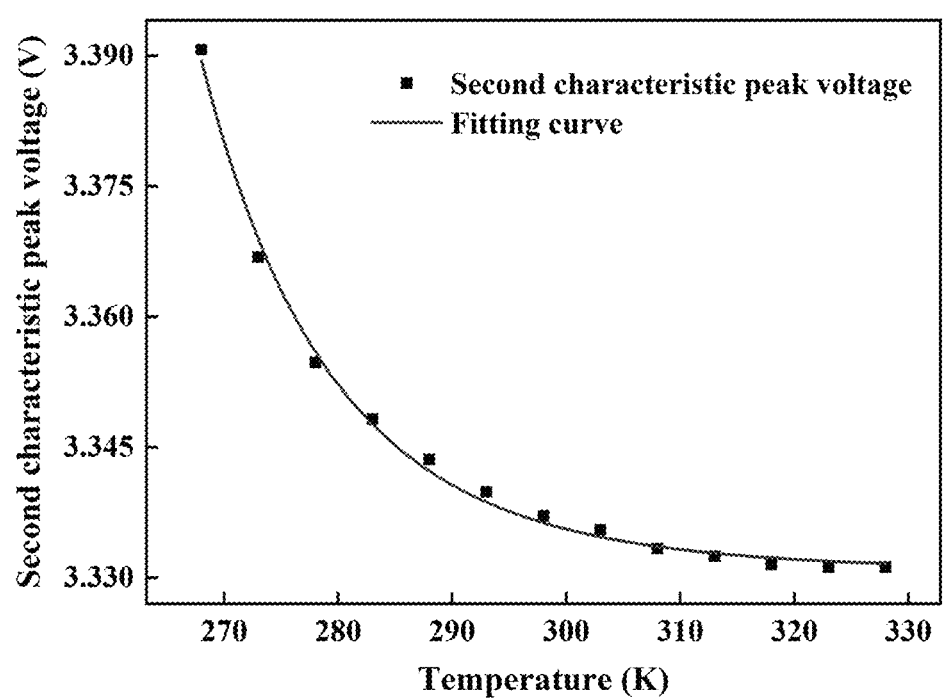
FIG. 3 shows the relation between the voltage of the characteristic peak and the temperature of the standard sample battery.

The above calibration mechanism relationship 1): When the battery is not aging, the voltage deviation caused by the change of $R_{ct}$ is obtained based on the "standard sample". The "standard sample" battery is a virtual battery after the average of at least three batteries that meet the factory requirements (State of Health is 100%). The basic parameters of the tested battery used in the invention are shown in Table 1. Of course, this is only for the purpose of expound relevant theories, and the number of batteries and basic battery parameters are not limited. The State of Health of the standard sample battery at different temperatures is 100%, that is, the battery is not aging. At this time, the voltage deviation of the second characteristic peak caused by temperature is theoretically affected by the change of $R_{ct}$. FIG. 3 shows the second characteristic peak voltage of the standard sample battery at different temperatures and the fitting results by the Arrhenius function. Table 2 shows the fitting parameters of the Arrhenius function. In order to quantitatively evaluate the quality of the fitting results, the $R^2$ is calculated, which can be expressed as:

$$R^2 = 1 - \frac{\sum_{i=1}^{N}(V_i - \tilde{V}_i)^2}{\sum_{i=1}^{N}(V_i - \hat{V}_{mean})^2}, \hat{V}_{mean} = \frac{1}{N}\sum_{i=1}^{N} V_i \qquad (8)$$

Where, $V_i$ is the measured voltage, $\tilde{V}_i$ denotes the fitting voltage, $\hat{V}_{mean}$ is the mean of the measured voltage, and N denotes the amount of measured data. The closer $R^2$ is to 1, the better the fitting accuracy is. It can be from the Table that $R^2$ is 0.996. Obviously, the Arrhenius function can better describe the voltage deviation caused by temperature.

For batteries with different aging states, the measured temperature is brought into the Arrhenius function to obtain the voltage deviation caused by temperature firstly. Then, the voltage deviation caused by the corresponding temperature be subtracted from the measured voltage of the characteristic peak to eliminate the effect of $R_{ct}$.

TABLE 1

Parameters of the tested battery

| Item | Parameter |
| --- | --- |
| Rated capacity | 1.3 Ah |
| Rated voltage | 3.2 V |
| Voltage range | 2.5~3.65 V |
| Size | 18 mm (D) * 65 mm (T) |

TABLE 2

Fitting coefficients of the Arrhenius function for voltage deviation caused by temperature

| $a_{ct}$ | $b_{ct}$ | $c_{ct}$ | R-square |
| --- | --- | --- | --- |
| 3.444 * $10^{-14}$ | 6313.57 | 3.331 | 0.996 |

Figure 4:
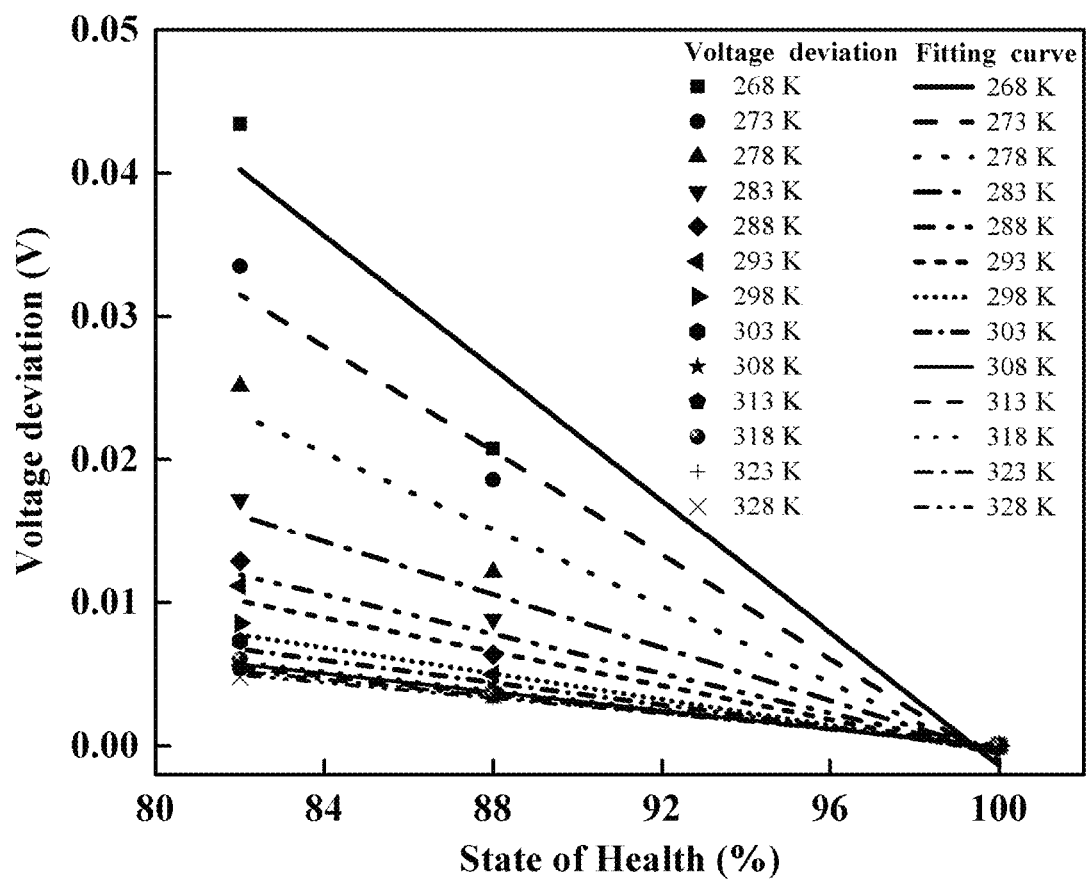
FIG. 4 shows the relation between the aging state and the voltage deviation at different temperatures.

The above calibration mechanism relationship 2) is the linear relationship function between the aging state and the voltage deviation: The present invention selects three batteries with State of Health of 100%, 88% and 82% respectively to analyze the linear relationship between the aging state and the voltage deviation. Of course, this is only for the purpose of expound relevant theories, and the number of batteries and basic battery parameters are not limited. Among them, the voltage deviation is the result of eliminating the influence of $R_{ct}$, as shown in FIG. 4. In the early aging stage, the aging state and impedance have an approximate linear relationship, and the slight difference may mainly come from the simplified processing of the complex components of the Solid Electrolyte Interface film. The corresponding linear relationship fitting curve is also shown in FIG. 4. Table 3 gives the linear relationship coefficient at different temperatures. It can be seen from the table that $k_{SEI,T}$ and $b_{SEI,T}$ have a linear relationship, $k_{SEI,T}=-0.01 b_{SEI,T}$, so the above linear relationship function can be further simplified as:

$$\Delta U_{SEI,cycle}=-0.01 b_{SEI} SOH + b_{SEI} \quad (9)$$

Figure 5:
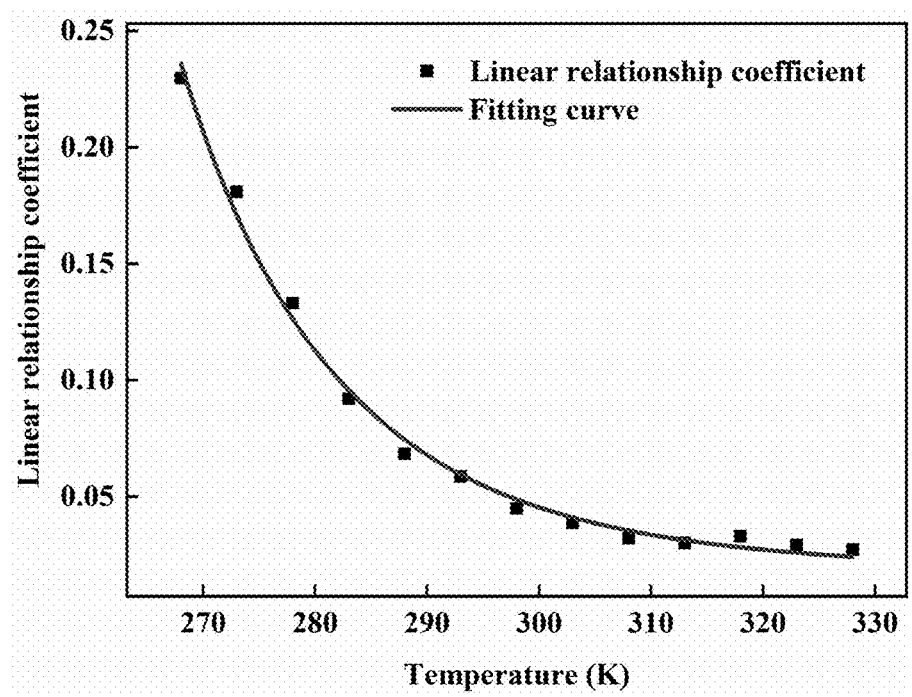
FIG. 5 shows the relation between the linear relationship coefficient and the temperature.

The above calibration mechanism relationship 3) is the relation function between the linear relationship coefficient and temperature at different temperatures: From the above-mentioned temperature and aging dual-embedded decoupling analysis, the linear relationship coefficient $k_{SEI,T}$, $b_{SEI,T}$ and temperature conforms to the Arrhenius function. The coefficients $b_{SEI,T}$ in Table 3 are fitted, and the specific results are shown in FIG. 5 and the fitting parameters are shown in Table 4. The $R^2$ is 0.994, indicating that the curve has a good fitting degree.

TABLE 3

Linear relationship coefficient at different temperatures

| Temperature/K | $k_{SEI}$ | $b_{SEI}$ | R-square |
|---|---|---|---|
| 268 | −0.00231 | 0.22964 | 0.955 |
| 273 | −0.00182 | 0.18077 | 0.984 |
| 278 | −0.00134 | 0.13303 | 0.956 |
| 283 | −9.25E−04 | 0.09193 | 0.970 |
| 288 | −6.88E−04 | 0.06835 | 0.962 |
| 293 | −5.90E−04 | 0.05852 | 0.937 |
| 298 | −4.52E−04 | 0.04482 | 0.942 |
| 303 | −3.89E−04 | 0.03866 | 0.960 |
| 308 | −3.22E−04 | 0.03209 | 0.990 |
| 313 | −3.01E−04 | 0.03007 | 0.999 |
| 318 | −3.30E−04 | 0.03293 | 0.992 |
| 323 | −2.91E−04 | 0.02909 | 0.999 |
| 328 | −2.71E−04 | 0.02720 | 0.993 |

TABLE 4

Fitting parameters of the linear relationship coefficient

| $A_{SEI}$ | $B_{SEI}$ | $C_{SEI}$ | R-square |
|---|---|---|---|
| 7.6246 * $10^{-10}$ | 5218.66 | 0.0179 | 0.994 |

Figure 6:
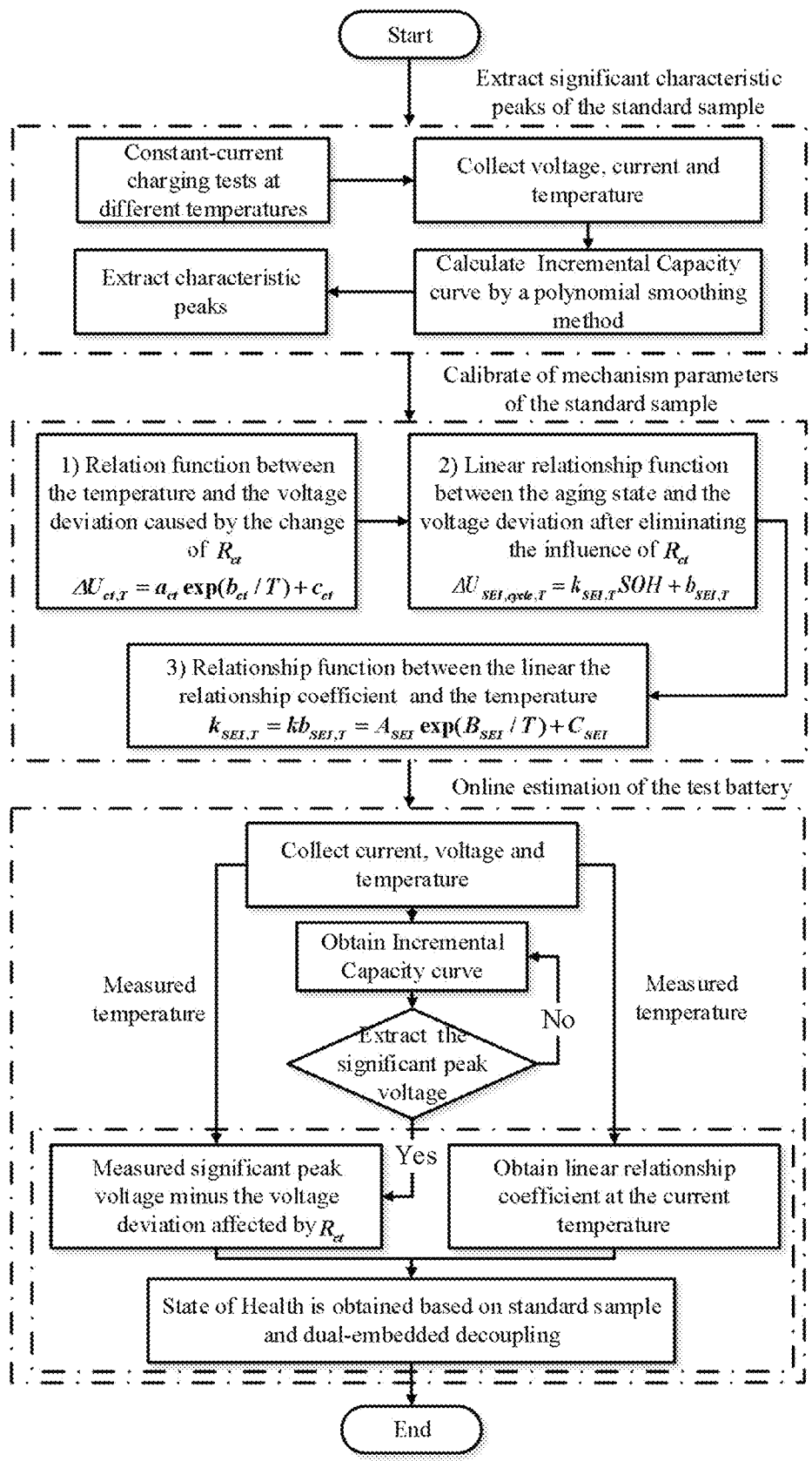
FIG. 6 shows a flow chart of the estimated method.

The online estimation stage: The voltage, current and temperature of a measured battery during the charging process are collected by Battery Management System (BMS), and the Incremental Capacity curve of the measured battery is then solved and the second characteristic peak voltage is extracted. Based on the extracted the second characteristic peak voltage and the calibrated mechanism relationships, the State of Health of the measured battery is eventually estimated. The specific State of Health estimated process is as follows: Firstly, the measured temperature is taken as the input to obtain the voltage deviation caused by $R_{ct}$, and the standard voltage deviation is obtained by subtracting the voltage deviation caused by $R_{ct}$ from the measured second characteristic peak voltage. Then, the temperature is brought into the Arrhenius function to calculated the linear relationship coefficient $k_{SEI,T}$ and $b_{SEI,T}$. Finally, the State of Health is solved based on the calibration mechanism relationship between the linear relationship coefficient and the standard voltage deviation, the online State of Health estimation in a wide temperature range is realized. The specific process is shown in FIG. 6. Here is an example to illustrate:

Taken the measured voltage of the second characteristic peak $U_{peak}$ and temperature $T_{peak}$ as input and State of Health as output, the estimated expression is as follows:

$$\begin{cases} \Delta U_{SEI,cycle,T} = U_{B,peak} - U_{ct,T} \\ U_{ct,T} = 3.444 \times 10^{-14} \cdot \exp\left(\dfrac{6313.57}{T}\right) + 3.331 \\ b_{SEI,T} = -100 \cdot k_{SEI,T} = 7.6246 \times 10^{-10} \cdot \exp\left(\dfrac{5218.66}{T}\right) + 0.0179 \\ SOH = \dfrac{\Delta U_{SEI,cycle,T} - b_{SEI,T}}{-0.01 b_{SEI,T}} \end{cases} \quad (10)$$

The State of Health of No. 1~3 batteries at different temperatures is obtained, and the estimated results of State of Health are shown in Table 5. It can be seen from the table that the relative error is 4.03%. The average relative errors of No. 2 battery and No. 3 battery are 2.41% and 1.21%, respectively. It shows that the proposed method can realize the State of Health estimation of the measured battery in the wide temperature range.

TABLE 5

Estimated State of Health of different aging batteries

| Temperature (K) | Predicted State of Health (Measured 88%) | Relative error | Predicted State of Health (Measured 82%) | Relative error |
|---|---|---|---|---|
| 268 | 91.21% | 3.21% | 81.63% | −0.37% |
| 273 | 89.10% | 1.10% | 80.39% | −1.61% |
| 278 | 90.42% | 2.42% | 80.10% | −1.90% |
| 283 | 90.77% | 2.77% | 82.01% | 0.01% |
| 288 | 91.45% | 3.45% | 82.70% | 0.70% |
| 293 | 91.64% | 3.64% | 81.20% | −0.80% |
| 298 | 92.03% | 4.03% | 82.47% | 0.47% |
| 303 | 91.29% | 3.29% | 82.20% | 0.20% |
| 308 | 90.30% | 2.30% | 83.28% | 1.28% |
| 313 | 88.57% | 0.57% | 82.60% | 0.60% |
| 318 | 87.32% | −0.68% | 78.50% | −3.50% |
| 323 | 86.91% | −1.09% | 79.59% | −2.41% |
| 328 | 85.20% | −2.80% | 80.06% | −1.94% |

The embodiments are the preferred embodiments of the present invention, but the present invention is not limited to the above-mentioned embodiments. Without departing from the essence of the present invention, any obvious improvements, substitutions or modifications that can be made by those skilled in the art fall within the protection scope of the present invention.

What is claimed is:
1. A battery State of Health estimation method based on a standard sample and a dual-embedded decoupling, comprising the following steps:
  S1: extracting significant characteristic peaks of the standard sample; wherein
    a same type of batteries with different aging states are selected to conduct constant-current charging tests at a same temperature;
    any one of the above batteries is selected to carry out the constant-current charging tests at different temperatures, and battery current, voltage, and temperature in each test are collected;
    based on the above data, Incremental Capacity curves of batteries with different aging states and at different temperatures are drawn, and the significant characteristic peaks of the standard sample are selected by analyzing the above Incremental Capacity curves;

S2: calibration of mechanism parameters of the standard sample; wherein relation functions of the standard sample are obtained based on the dual-embedded decoupling; wherein
   a first relation function is a relation function between a temperature and a first voltage deviation $\Delta U_{ct,T}$ caused by a change of a charge transfer resistance $R_{ct}$, when the standard sample battery is not aging;
   a second relation function is a linear relationship function between an aging state and a second voltage deviation $\Delta U_{SEI,cycle,T}$ at the same temperature; wherein the second voltage deviation $\Delta U_{SEI,cycle,T}$ is caused by a Solid Electrolyte Interface film resistance after eliminating an influence of the charge transfer resistance $R_{ct}$;
   a third relation function is a relationship function between a linear relationship coefficient and the temperature;
S3: on-line estimation of State of Health of a test battery; wherein a constant-current charging test is carried out for the test battery, and the battery current, voltage, and temperature are collected; based on the collected data, the Incremental Capacity 11 curve of the test battery is calculated and a voltage of the significant characteristic peak corresponding to the standard sample is extracted; State of Health of the test battery is solved step by step according to the three relation functions of the double-embedded decoupling in S2.

2. The battery State of Health estimation method based on the standard sample and the dual-embedded decoupling according to claim 1, wherein the significant characteristic peak is located near a median voltage.

3. The battery State of Health estimation method based on the standard sample and the dual-embedded decoupling according to claim 1, wherein, in the first relation function in S2, a voltage deviation caused by the change of the charge transfer resistance $R_{ct}$ is the first voltage deviation $\Delta U_{ct,T}$ caused by the temperature at the significant characteristic peak of the standard sample battery whose State of Health is 100%, when the battery is not aging; the relation function between the temperature T and the first voltage deviation $\Delta U_{ct,T}$ of the standard sample battery is described by an Arrhenius function as:

$$\Delta U_{ct,T}=a_{ct}\exp(b_{ct}/T)+c_{ct}$$

wherein, $a_{ct}$, $b_{ct}$ and $c_{ct}$ are temperature fitting parameters related to the charge transfer resistance $R_{ct}$.

4. The battery State of Health estimation method based on the standard sample and the dual-embedded decoupling according to claim 3, wherein, the standard sample battery with 100% State of Health is a virtual battery after an average of at least three batteries with 100% State of Health that meet factory requirements; a fitting result is quantitatively evaluated by a coefficient of determination $R^2$; a specific evaluation formula is as follows:

$$R^2=1-\frac{\sum_{i=1}^{N}(V_i-\tilde{V}_i)^2}{\sum_{i=1}^{N}(V_i-\hat{V}_{mean})^2},\ \hat{V}_{mean}=\frac{1}{N}\sum_{i=1}^{N}V_i$$

wherein, $V_i$ is a measured voltage, $\tilde{V}_i$ denotes a fitting voltage, $\hat{V}_{mean}$ is a mean of the measured voltage, and N denotes an amount of measured data; the closer $R^2$ is to 1, the better a fitting accuracy is.

5. The battery State of Health estimation method based on the standard sample and the dual-embedded decoupling according to claim 1, wherein, in the second relation function in S2, the linear relationship function between the aging state and the second voltage deviation $\Delta U_{SEI,cycle,T}$ caused by an influence of the Solid Electrolyte Interface film resistance at the same temperature is described as:

$$\Delta U_{SEI,cycle,T}=k_{SEI,T}SOH+b_{SEI,T}$$

wherein, $k_{SEI,T}$ and $b_{SEI,T}$ are linear relationship coefficients related to the Solid Electrolyte Interface film resistance, SOH is battery State of Health.

6. The battery State of Health estimation method based on the standard sample and the dual-embedded decoupling according to claim 5, wherein, a method to obtain the linear relationship function between the aging state and the second voltage deviation after eliminating the influence of $R_{ct}$ is as follows:
   firstly, at least three test batteries with State of Health between 100% and 80% are selected;
   then the linear relationship function between the aging state and the second voltage deviation $\Delta U_{SEI,cycle,T}$ is linear fitted;
   finally, a relationship between linear fitting parameters $k_{SEI,T}$ and $b_{SEI,T}$ is obtained; wherein $k_{SEI,T}=-0.01b_{SEI,T}$ thus, the above linear relationship function between the aging state and the second voltage deviation $\Delta U_{SEI,cycle,T}$ is further simplified as:

$$\Delta U_{SEI,cycle,T}=-0.01b_{SEI,T}SOH+b_{SEI,T}.$$

7. The battery State of Health estimation method based on standard sample and dual-embedded decoupling according to claim 1, wherein, in the third relation function in S3, the relationship function between the linear relationship coefficient and the temperature T is described as:

$$k_{SEI,T}=kb_{SEI,T}=A_{SEI}\exp(B_{SEI}/T)+C_{SEI}$$

wherein, $A_{SEI}$, $B_{SEI}$ and $C_{SEI}$ are temperature fitting parameters related to the Solid Electrolyte Interface film resistance; k represents the linear relationship coefficient between $k_{SEI,T}$ and $b_{SEI,T}$.

8. The battery State of Health estimation method based on the standard sample and the dual-embedded decoupling according to claim 1, wherein, a solution method of State of Health in S3 is as follows:
   first, a measured temperature $T_{peak}$ is taken as input and $\Delta U_{ct,T}$ is obtained according to the relation function between the temperature and the first voltage deviation $\Delta U_{ct,T}$ in S2;
   secondly, a measured voltage $U_{peak}$ is taken as input to obtain $\Delta U_{SEI,cycle,T}$ according to $\Delta U_{SEI,cycle,T}=U_{peak}-\Delta U_{ct,T}$;
   thirdly, according to the third relation function between the linear relationship coefficient and the temperature at different temperatures in S2, the measured temperature $T_{peak}$ is taken as the input to obtain the linear relationship coefficient at a current temperature;
   finally, according to the linear relationship function between the aging state and the second voltage deviation $\Delta U_{SEI,cycle,T}$ the State of Health of the test battery is obtained.

* * * * *